US012579348B2

(12) United States Patent
Liu et al.

(10) Patent No.: US 12,579,348 B2
(45) Date of Patent: Mar. 17, 2026

(54) METHOD, DEVICE, MEDIUM AND ELECTRONIC DEVICE FOR IMPROVING NITROGEN WATER QUALITY OF DAMMED RIVER BASED ON RESERVOIR OPERATION

(71) Applicant: NANJING HYDRAULIC RESEARCH INSTITUTE, Jiangsu (CN)

(72) Inventors: Dongsheng Liu, Jiangsu (CN); Zhiyuan Wang, Jiangsu (CN); Tianyuan Zheng, Shandong (CN); Qiuheng Zhu, Jiangsu (CN); Wenting Zhang, Jiangsu (CN); Zixuan Ma, Jiangsu (CN); Jingjie Sun, Jiangsu (CN); Yang Chen, Jiangsu (CN)

(73) Assignee: NANJING HYDRAULIC RESEARCH INSTITUTE, Jiangsu (CN)

( * ) Notice: Subject to any disclaimer, the term of this patent is extended or adjusted under 35 U.S.C. 154(b) by 0 days.

(21) Appl. No.: 18/817,138

(22) Filed: Aug. 27, 2024

(65) Prior Publication Data

US 2025/0217560 A1 Jul. 3, 2025

(30) Foreign Application Priority Data

Dec. 28, 2023 (CN) .......................... 202311842304.8

(51) Int. Cl.
*G06F 30/28* (2020.01)

(52) U.S. Cl.
CPC .................................... *G06F 30/28* (2020.01)

(58) Field of Classification Search
CPC ...... G06F 30/20; G06F 30/28; G06F 2111/10; G06F 2113/08
See application file for complete search history.

(56) References Cited

FOREIGN PATENT DOCUMENTS

| CN | 108573302 A | * | 9/2018 | ............. G06N 3/006 |
| CN | 110197017 | | 9/2019 | |
| CN | 111241758 | | 6/2020 | |

OTHER PUBLICATIONS

Chanson, Environmental Hydraulics of Open Channel Flows, Elsevier, 2004 (Year: 2004).*

(Continued)

*Primary Examiner* — Jesse P Frumkin
*Assistant Examiner* — Theodore Charles Striegel
(74) *Attorney, Agent, or Firm* — JCIPRNET

(57) ABSTRACT

The present belongs to the technical field of reservoir operation, including following steps: selecting a dammed river to be tested, determining a study area in a riparian zone downstream of a dam, obtaining historical long-sequence water level data of the study area, and analyzing duration and amplitude variation ranges of a historical water level; setting a plurality of groups of flood waves according to the duration and amplitude variation ranges; establishing a riparian zone nitrogen transport and transformation numerical model to simulate a denitrification level of the riparian zone under different flood wave conditions; obtaining an A/T ratio value of one flood wave corresponding to a maximum value of denitrification capacity of the riparian zone according to results of all cases; and taking the obtained A/T ratio value as a threshold of a reservoir discharge hydrograph.

3 Claims, 8 Drawing Sheets

(56)　　　　　　References Cited

OTHER PUBLICATIONS

Huang, Reactive Transport Modeling at the Pore Scale and Upscaling to the Darcy Scale [thesis], ETH Zurich, 2022 (Year: 2022).*

White et al., Subsurface Transport Over Multiple Phases—Version 2.0 Theory Guide, Mar. 2000 (Year: 2000).*

Boano et al, Hyporheic flow and transport processes: Mechanisms, models, and biogeochemical implications, Reviews of Geophysics 52: 603-679, Oct. 2014 (Year: 2014).*

Liu et al, Hyporheic exchange mechanism driven by flood wave, Hydrological Processes 34: 5429-5440, Oct. 2020 (Year: 2020).*

Shuai et al, Denitrification in the banks of fluctuating rivers: The effects of river stage amplitude, sediment hydraulic conductivity and dispersivity, and ambient groundwater flow, Water Resources Research 53(9): 7951-7967, Sep. 2017 (Year: 2017).*

Wood et al, Effective reaction at a fluid-solid interface: Applications to biotransformation in porous media, Advances in Water Resources 30: 1630-1647, Sep. 2006 (Year: 2006).*

Zarnetske et al, Coupled transport and reaction kinetics control the nitrate source-sink function of hyporheic zones, Water Resources Research 48(11): W11508, pp. 1-15, Nov. 2012 (Year: 2012).*

Dongsheng Liu et al., "Regulating flow to maximize riverine nitrogen removal by riparian zones downstream of reservoirs", Journal of Hydrology, Jun. 16, 2024, pp. 1-9, vol. 638.

* cited by examiner

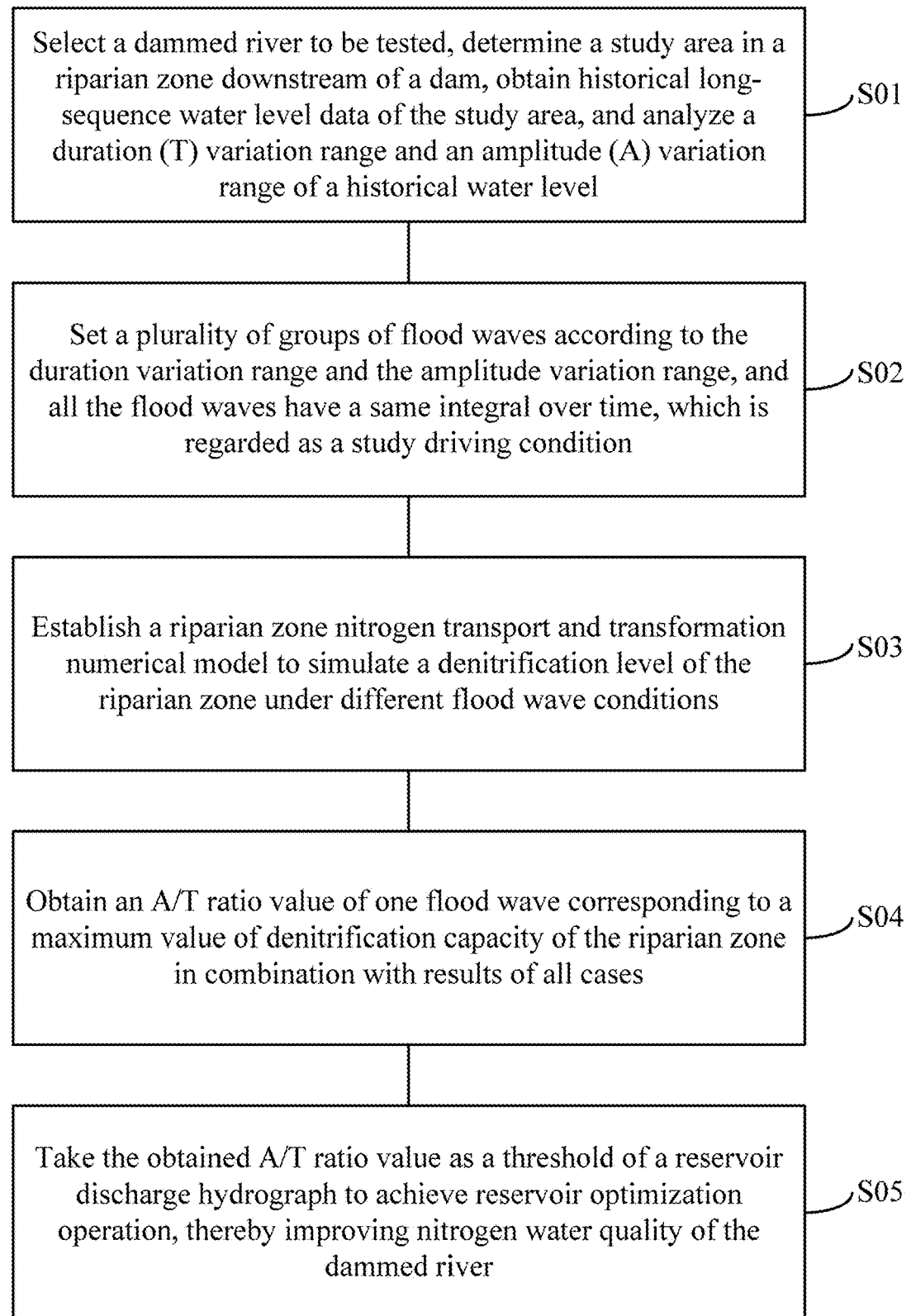

Select a dammed river to be tested, determine a study area in a riparian zone downstream of a dam, obtain historical long-sequence water level data of the study area, and analyze a duration (T) variation range and an amplitude (A) variation range of a historical water level — S01

Set a plurality of groups of flood waves according to the duration variation range and the amplitude variation range, and all the flood waves have a same integral over time, which is regarded as a study driving condition — S02

Establish a riparian zone nitrogen transport and transformation numerical model to simulate a denitrification level of the riparian zone under different flood wave conditions — S03

Obtain an A/T ratio value of one flood wave corresponding to a maximum value of denitrification capacity of the riparian zone in combination with results of all cases — S04

Take the obtained A/T ratio value as a threshold of a reservoir discharge hydrograph to achieve reservoir optimization operation, thereby improving nitrogen water quality of the dammed river — S05

FIG. 1

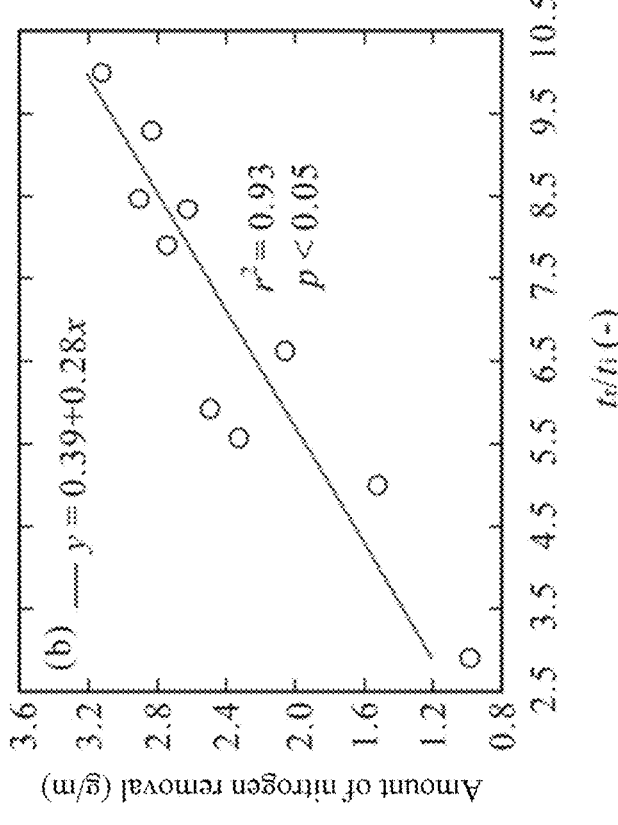
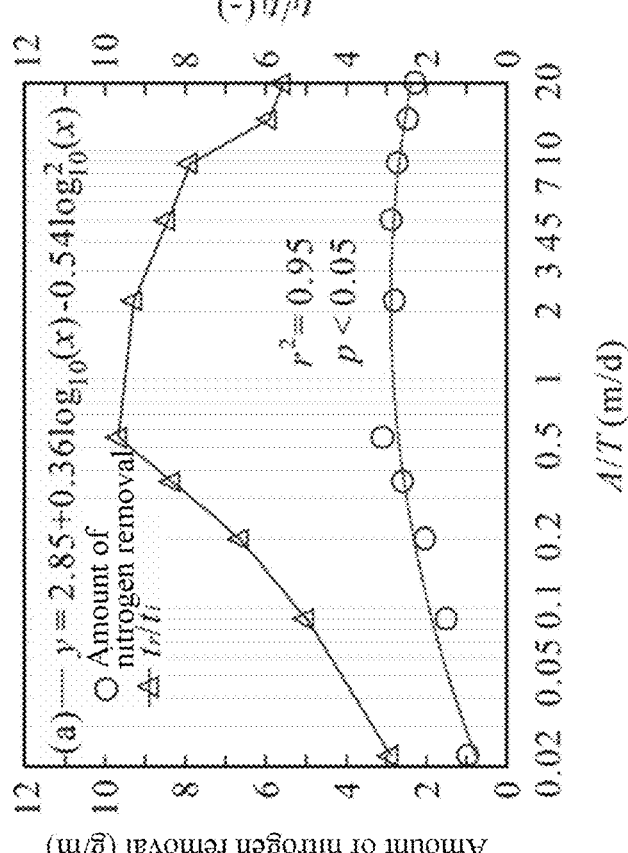
FIG. 7

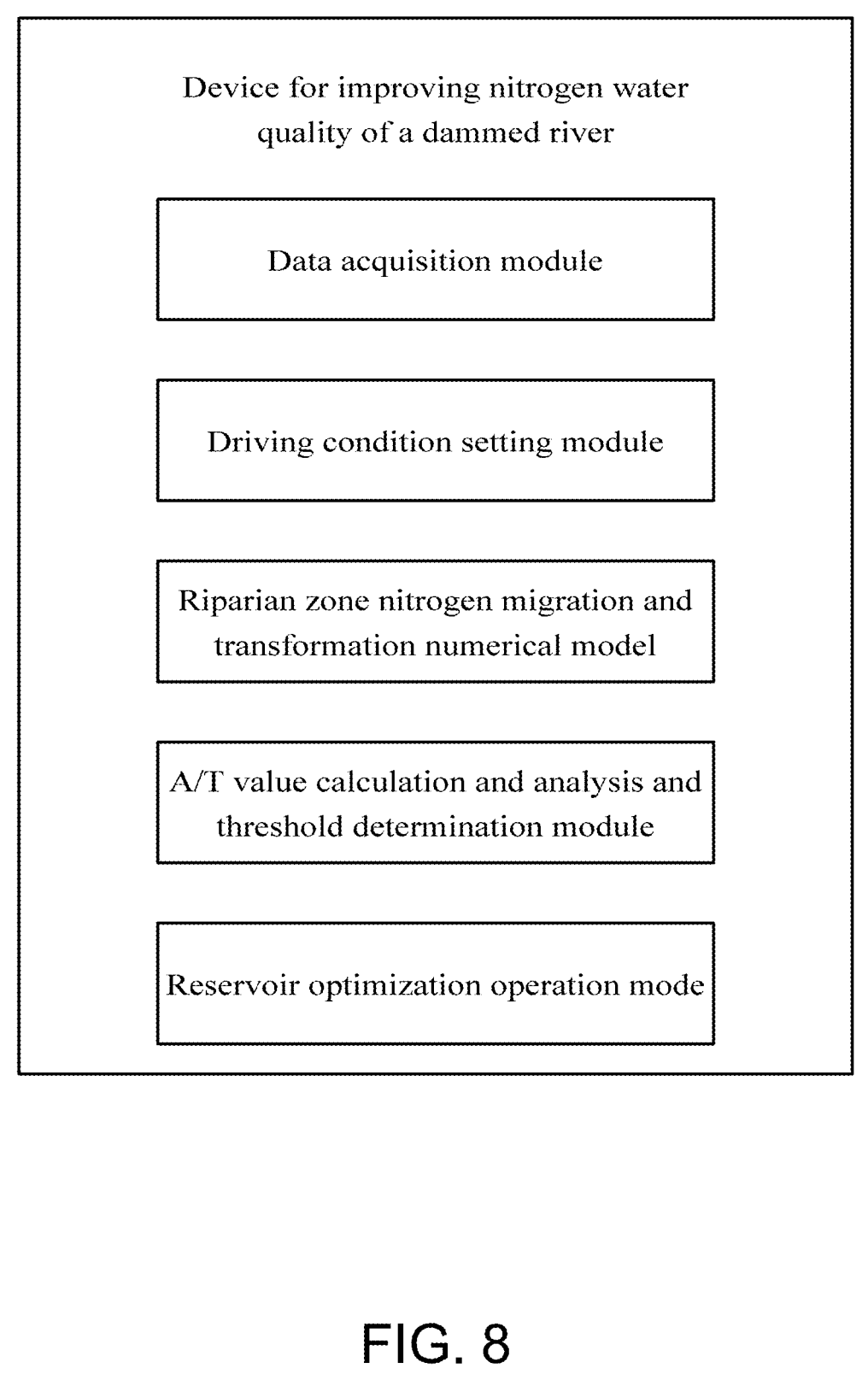

Device for improving nitrogen water
quality of a dammed river

Data acquisition module

Driving condition setting module

Riparian zone nitrogen migration and
transformation numerical model

A/T value calculation and analysis and
threshold determination module

Reservoir optimization operation mode

FIG. 8

METHOD, DEVICE, MEDIUM AND ELECTRONIC DEVICE FOR IMPROVING NITROGEN WATER QUALITY OF DAMMED RIVER BASED ON RESERVOIR OPERATION

CROSS-REFERENCE TO RELATED APPLICATION

This application claims the priority benefit of China application serial no. 202311842304.8, filed on Dec. 28, 2023. The entirety of the above-mentioned patent application is hereby incorporated by reference herein and made a part of this specification.

TECHNICAL FIELD

The present disclosure belongs to the technical field of reservoir operation, relates to a reservoir discharge hydrograph optimization design method, which is capable of maximizing nitrogen removal capability of a riparian zone, and effectively contributing to the improvement of nitrogen water quality in a dammed river, and particularly relates to a method, a device, an electronic device and a computer-readable medium for improving nitrogen water quality of a dammed river based on reservoir operation.

BACKGROUND

Nitrogen is an important biogenic element in aquatic ecosystems, but excessive nitrogen will lead to a heap of environmental problems such as nitrogen pollution and eutrophication in water bodies. The construction of dams changes an original hydrological regime of rivers, weakens hydrodynamic condition of the rivers, and affects the transport and transformation of nitrogen biogenic element in natural river channels, which results in nitrogen accumulation in the water bodies and delivers a significant impact on reservoirs and downstream of the aquatic ecosystems, and poses a serious threat to drinking water safety and human health. Therefore, nitrogen pollution control in dammed rivers is an important research topic.

Research on reservoir operation in China is divided into two stages:

a first stage involves the reservoir operation methods that are still extensively used nowadays, which refer to storage and discharge rules formulated based on social and economic tasks undertaken by the reservoirs. The reservoir operation methods are mainly categorized into two types, that is, flood control operation and economic operation. Most reservoirs in China have comprehensive functions such as flood control, power generation, water supply, and irrigation, and each of the reservoirs focuses on different functions. A main drawback of these reservoir operation methods is their focuses on social and economic functions and striving to maximize economic benefits, but disregarding ecological needs of downstream of the reservoir and a reservoir area.

Considering the drawback of the reservoir operation methods in the first stage, multi-objective ecological operation technology is employed in a second stage to implement ecological compensation for the rivers while achieving various social and economic objectives, such as flood control, power generation, water supply, irrigation, and navigation, For example, ensuring water required for maintaining basic functions of rivers downstream of the reservoir, that is "ecological base flow"; simulating reservoir discharge modes of a natural hydrological regime to create hydrological and hydraulic conditions suitable for propagation, spawning and growth of important organisms in the rivers; reducing sediment deposition and prolonging service life of the reservoir by taking such measures as "storing clear water and discharging muddy water", adjusting a water level and discharging sediment through a bottom hole; lowering an impounded level in front of the dam in a certain period of time to alleviate a pressure on a water level at reservoir junctions and bays, thereby accelerating a flow velocity in slow-flowing areas and destroying conditions for eutrophication of the water bodies; taking opportunities of increasing water discharge through a surface hole, so as to solve the problems that fish spawning and breeding are affected by a vertical stratification structure of a reservoir water temperature and cold water outflow, thereby meeting ecological requirements downstream of the reservoir; and recovering and enhancing connectivity of a water system, including the connectivity of main and tributary rivers, the connectivity of rivers and lakes, and the like, by adjusting a scheduling and operation mode of a gate dam, so as to relieve the division of water conservancy engineering buildings on the main and tributary rivers and the blocking effects of the rivers and lakes.

Overall, reservoir operation has been gradually shifted from traditional flood control operation and economic operation to multi-objective ecological operation. Nevertheless, the current ecological reservoir operation mainly focuses on ecological issues, such as downstream ecological flow guarantee and fish protection, and some preliminary research results have been gained. Research on operation of reservoir water quality improvement is relatively scarce. Therefore, incorporating water quality improvement as one of the objectives into the existing multi-objective ecological reservoir operation methods is of significant importance of the water ecological and environmental health of dammed rivers.

The existing technology is the multi-objective ecological reservoir operation technology with the aim of implementing ecological compensation for the rivers while achieving various social and economic objectives, such as flood control, power generation, water supply, irrigation, and navigation, with a specific implementation plan as follows:

various objectives, including flood control, water resource guarantee, downstream ecological base flow, water temperature and hydrological objectives for fish spawning and reproduction, and sediment discharge objective, and the like are set; simulation of hydrological-water environmental-water ecological operation of the dammed rivers with different combinations of irrigation pumping, flood drainage, culvert drainage, and ecological water diversion is performed to determine an optimal solution for reservoir hydraulic control (that is, an appropriate discharge hydrograph of the reservoir) by establishing a set of conditional constraint equations based on the improvement of water resources, environmental conditions, water ecology and multiple objectives to form the multi-objective ecological reservoir operation technology.

The current multi-objective ecological reservoir operation mainly focuses on ecological issues, such as downstream ecological flow guarantee and fish protection, and some preliminary research results have been gained. Research on operation of reservoir water quality improvement is relatively scarce. Therefore, aiming at nitrogen pollution in the reservoir, the present disclosure provides a reservoir discharge hydrograph optimization design method based on nitrogen water quality improvement, which is crucial for improving water quality conditions in the reservoir and downstream areas, and constitutes an important sector that needs to be refined for the existing multi-objective ecological reservoir operation methods.

SUMMARY

Objectives of the present disclosure: one of the objectives of the present disclosure is to provide a method for improving nitrogen water quality of a dammed river based on reservoir operation, aiming to effectively improve nitrogen water quality indicators of the dammed river and improve the water environment conditions; another objective of the present disclosure is to provide a device for improving nitrogen water quality of a dammed river based on reservoir operation, and the other two objectives of the present disclosure are to provide an electronic device and provide a storage medium.

Technical solution: the present disclosure provides a method for improving nitrogen water quality of a dammed river based on reservoir operation, including following steps:

selecting a dammed river to be tested, determining a study area in a riparian zone downstream of a dam, obtaining historical long-sequence water level data of the study area, and analyzing a duration (T) variation range and an amplitude (A) variation range of a historical water level;

setting a plurality of groups of flood waves according to the duration variation range and the amplitude variation range, where all the flood waves have a same integral over time, which is regarded as a study driving condition;

establishing a riparian zone nitrogen transport and transformation numerical model to simulate a denitrification level of the riparian zone under different flood wave conditions;

obtaining an A/T ratio value of one flood wave corresponding to a maximum value of denitrification capacity of the riparian zone in combination with results of all cases; and taking the obtained A/T ratio value as a threshold of a reservoir discharge hydrograph to achieve reservoir optimization operation, thereby improving nitrogen water quality of the dammed river.

As a further improvement of the foregoing technical solution, the present disclosure provides a series of flood wave cases (A/T ratio=1/45, 4/45, 9/45, . . . , 900/45) with a fixed integral over time, and the cases are used to calculate and analyze change rules of denitrification capacity of the riparian zone below the dam with the wave A/T ratio, and on this basis, an A/T ratio of a discharge hydrograph is set on the premise of analyzing a fixed reservoir water volume, thereby maximizing the denitrification in the downstream of the riparian zone.

condition; effects of rainfall and evaporation are disregarded at an upper boundary above a maximum water level; submersion below a minimum water level in the riparian zone is selected as a variable head boundary condition; an area between the minimum water level and the maximum water level adopts a mixed boundary condition, combining variable head conditions and flow constraints to develop a seepage face; where for a water quality module, surface water and groundwater are selected as constant concentration boundaries, while remaining boundaries have no concentration boundaries; an initial head field and a concentration field in a model domain are simulated using a steady-state model; a boundary of the area between the minimum water level and the maximum water level is defined as a fixed head, which is set as a measured value at the beginning of a study period, and other boundary conditions remain unchanged.

As a further improvement of the foregoing technical solution, model control equations of the 2D model include:

$$S_0 \cdot s(\psi)\frac{\partial \psi}{\partial t} + \varepsilon\frac{\partial s(\psi)}{\partial t} + \nabla \cdot [-KK_r(\nabla\psi + \nabla z)] = \alpha s(\psi)\frac{\partial \sigma_T}{\partial t}, \quad (1)$$

$$\frac{\partial}{\partial t}(\theta C_i) - \nabla \cdot (\theta D \nabla C_i) + \nabla \cdot (q C_i) = R_i, \quad (2)$$

where $S_o$ is a specific storage; s is a saturation; $\varepsilon$ is a porosity; $\psi$ is a pressure head; t is time; K is a tensor of a hydraulic conductivity of a saturated medium; $K_r$ is a relative hydraulic conductivity; z is a position head; $\alpha$ is a skeleton compression coefficient of a porous medium; $\sigma_T$ is a total stress; $\theta$ is a water content; $C_i$ is a concentration of a solute i; D is a tensor of a hydrodynamic dispersion coefficient; q is a Darcy velocity vector; and $R_i$ is a reaction rate of the solute i.

Specifically, $R_i$ in Eq. (2) can be expressed as follows:

$$R_{O2} = -\theta U_{AR} y_{O2}\left(\frac{C_{DOC}}{K_{DOC} + C_{DOC}}\right)\left(\frac{C_{O2}}{K_{O2} + C_{O2}}\right) - \quad (3)$$
$$\theta U_{NT}(1 - y_{O2})\left(\frac{C_{NH4}}{K_{NH4} + C_{NH4}}\right)\left(\frac{C_{O2}}{K_{O2} + C_{O2}}\right),$$

$$R_{NH4} = -\theta U_{NT}\left(\frac{C_{NH4}}{K_{NH4} + C_{NH4}}\right)\left(\frac{C_{O2}}{K_{O2} + C_{O2}}\right), \quad (4)$$

$$R_{NO3} = \theta U_{NT}\left(\frac{C_{NH4}}{K_{NH4} + C_{NH4}}\right)\left(\frac{C_{O2}}{K_{O2} + C_{O2}}\right) - \quad (5)$$
$$\theta U_{DN}\left(\frac{K_I}{K_I + C_{O2}}\right)\left(\frac{C_{DOC}}{K_{DOC} + C_{DOC}}\right)\left(\frac{C_{NO3}}{K_{NO3} + C_{NO3}}\right),$$

| | Case 1 | Case 2 | Case 3 | Case 4 | Case 5 | Case 6 | Case 7 | Case 8 | Case 9 | Case 10 |
|---|---|---|---|---|---|---|---|---|---|---|
| A | 0.2 | 0.4 | 0.6 | 0.8 | 1 | 2 | 3 | 4 | 5 | 6 |
| T | 9 | 4.5 | 3 | 2.25 | 1.8 | 0.9 | 0.6 | 0.45 | 0.36 | 0.3 |
| A/T | 1/45 | 4/45 | 9/45 | 16/45 | 25/45 | 100/45 | 225/45 | 400/45 | 625/45 | 900/45 |
| ∫h(t) | 1.8 | 1.8 | 1.8 | 1.8 | 1.8 | 1.8 | 1.8 | 1.8 | 1.8 | 1.8 |

As a further improvement of the foregoing technical solution, the riparian zone nitrogen transport and transformation numerical model is a two-dimensional (2D) model, which is configured to simulate a denitrification level of the riparian zone under different flood wave conditions; in the 2D model, left and bottom boundaries of the 2D model are subjected to no-flux boundary conditions; a right boundary of the 2D model is defined as a constant head boundary -continued $$R_{DOC} = -\theta U_{AR} y_{O2}\left(\frac{C_{DOC}}{K_{DOC} + C_{DOC}}\right)\left(\frac{C_{O2}}{K_{O2} + C_{O2}}\right) - \quad (6)$$
$$\theta U_{DN}\left(\frac{K_I}{K_I + C_{O2}}\right)\left(\frac{C_{DOC}}{K_{DOC} + C_{DOC}}\right)\left(\frac{C_{NO3}}{K_{NO3} + C_{NO3}}\right),$$

where $R_{O2}$, $R_{NH4}$, $R_{NO3}$ and $R_{DOC}$ are reaction rates of $O_2$, $NH_4^+$, $NO_3^-$ and DOC, respectively; $C_{DOC}$, $C_{O2}$, $C_{NH4}$ and $C_{NO3}$ are concentrations of DOC, $O_2$, $NH_4^+$ and $NO_3^-$, respectively; $V_A$, $V_N$ and $V_D$ are maximum substrate uptake rates of aerobic respiration, nitrification, and denitrification; respectively; $X_{AR}$, $X_{NT}$ and $X_{DN}$ are functional microbial mediation coefficients for promoting the aerobic respiration, nitrification, and denitrification, respectively; $y_{O2}$ is a partition coefficient of $O_2$; $K_{DOC}$, $K_{O2}$, $K_{NH4}$ and $K_{NO3}$ are half-saturation constants of DOC, $CO_2$, $NH_4^+$ and $NO_3^-$, respectively; and $K_I$ is an inhibition constant.

As a further improvement of the foregoing technical solution, in a process of simulating a denitrification level of the riparian zone under different flood wave conditions, flood waves can be numerically formulated as follows:

$$h(t) = h_0 + A\sin^r\left[\left(\frac{t}{T}\right)^{-ln2/ln\left(\frac{t_p}{T}\right)}\pi\right], \tag{7}$$

where $h_0$ is a river bottom elevation (m); A, T, $t_p$ and r are an amplitude (m), a duration (d), a duration of water level rise and a waveform parameter of the flood wave, respectively.

As a further improvement of the foregoing technical solution, in a process of simulating a denitrification level of the riparian zone under different flood wave conditions, methods for calculating hyporheic exchange and nitrogen removal in the riparian zone of the study area include:

A water infiltration volume per unit length along a river is defined as follows:

$$Q(t) = \int_0^t dt \int_0^l v(l, t)dl, \tag{8}$$

where v(l,t) is a normal velocity along the drawdown area (m/d); l is a length of the drawdown area (m); and t is time (d).

Time taken for Q(t) to increase from zero to a maximum value thereof is defined as infiltration time ($t_i$) of a water body, and time required for Q(t) to decrease from the maximum value to zero is defined as return time ($t_r$) of the water body; and a sum of $t_i$ and $t_r$ is residence time of an infiltrating water body.

Infiltration volume of a solute j (per unit length along the river) is calculated as follows:

$$M_j(t) = \int_0^t dt \int_0^l [v(l, t) \cdot c_j(l, t) + D \cdot i(l, t)]dl, \tag{9}$$

where $c_j$(l,t) is a concentration of the solute j at a river-sediment interface (mg/L); D is a hydrodynamic dispersion coefficient (m); and i(l,t) is a solute gradient between the river and the groundwater (mg/L).

Amount of nitrogen removal in the riparian zone (per unit length along the river) is calculated as follows:

$$M_{rem} = [M_{Cl^-}(t) - M_{NO3^-}(t)]|_{t=RT}, \tag{10}$$

where $M_{Cl^-}(t)$ and $M_{NO3^-}(t)$ are infiltration amounts of a conservative solute ($Cl^-$) and a reactive solute ($NO_3^-$—N) during one water level fluctuation cycle, respectively (per unit length along the river) (g/m), respectively; and RT is average residence time of the solutes (d).

In a further aspect, the present disclosure provides a device for improving nitrogen water quality of a dammed river based on reservoir operation, including:

a data acquisition module, where the data acquisition module is configured to select a dammed river to be tested, determine a study area in a riparian zone downstream of a dam, obtain historical long-sequence water level data of the study area, and analyze a duration (T) variation range and an amplitude (A) variation range of a historical water level;

a driving condition setting module, where the driving condition setting module is configured to set a plurality of groups of flood waves according to the duration variation range and the amplitude variation range, which is regarded as a study driving condition;

a riparian zone nitrogen transport and transformation numerical model, where the riparian zone nitrogen transport and transformation numerical model is configured to simulate a denitrification level of the riparian zone under different flood wave conditions;

an A/T ratio value calculation and analysis and threshold determination module, where the A/T ratio value calculation and analysis and threshold determination module is configured to obtain an A/T ratio value of one flood wave corresponding to a maximum value of denitrification capacity of the riparian zone in combination with results of all cases; and a reservoir optimization operation mode, where the reservoir optimization operation module is configured to take the obtained A/T ratio value as a threshold of a reservoir discharge hydrograph to achieve reservoir optimization operation, thereby improving nitrogen water quality of the dammed river.

In still a further aspect, the present disclosure provides a computer-readable medium having a computer program stored thereon, and when the computer program is executed by a processor, the foregoing method for improving nitrogen water quality of a dammed river based on reservoir operation is implemented.

In still a further aspect, the present disclosure provides an electronic device, including: one or more processors; and a storage device configured to store one or more programs, and when the one or more programs are executed by the one or more processors, the one or more processors implement the foregoing method for improving nitrogen water quality of a dammed river based on reservoir operation.

Inventive principles of the present disclosure are as follows:

Affected by reservoir outflow discharge, the water level downstream of the dam fluctuates violently, making the riparian zone downstream become a hotspot area for denitrification. Researches have indicated that as the amplitude (A) and the duration (T) of the water level increase, the amount of water infiltrated into the riparian zone and the residence time thereof also increase, resulting in an increase in infiltration volume of the solutes increase and a longer time period of chemical reaction, which in turn improves the nitrogen removal in the riparian zone. However, previous researches usually took A or T as a single variable to research its effects on nitrogen removal, which means that one variable is taken as a constant value, while the other variable is changed (that is, a control variable method). Therefore, rather than saying that the amount of nitrogen removal in the riparian zone is increased with an increase in A or T, it is more accurate to say that the amount of nitrogen removal in the riparian zone increases with an fixed-value integral over time of flood waves (IOFW).

Hence, it is unknown how the flood wave parameters (A, T) jointly affect the nitrogen removal in the riparian zone when IOFW is defined as a constant value. For example, when a reservoir manager discharges only a fixed amount of water, how should the discharge hydrograph is defined adjust the nitrogen removal capacity in the downstream of the riparian zone? When the discharge hydrograph is designed to have a shorter T and a larger A (that is, "tall and thin" waveforms), the downstream flood stage can cause more solutes to infiltrate into the riparian zone with a shorter residence time, in which case, the nitrogen removal in the riparian zone is restricted by the reaction time. In contrast, a discharge hydrograph with a longer T but a smaller A (that is, "short and wide" waveforms) may reduce the amount of solutes infiltrated into the riparian zone, resulting in a longer residence time. However, since the infiltration volume of solutes capable of being used for denitrification is small, the nitrogen removal is also restricted. Therefore, A and T of the flood waves are variables associated with each other, and there may be a threshold value of a ratio of the amplitude to the duration (A/T ratio) that can maximize the nitrogen removal in the riparian zone. However, how the A/T of the downstream flood waves specifically affects nitrogen removal in the riparian zone under a fixed IOFW is less well studied.

The present disclosure researches the denitrification process of the riparian zone downstream of the dam under various flood wave conditions by using a numerical model, with the aim of finding the threshold value of the discharge hydrograph A/T, and maximizing the denitrification capacity of the downstream of the riparian zone.

BRIEF DESCRIPTION OF THE DRAWINGS

FIG. 1 is a schematic flowchart according to an embodiment of the present disclosure.

(a) of FIG. 7 shows effects of a wave A/T ratio on nitrogen removal in a riparian zone, and effects of the wave A/T ratio on a return/infiltration time ratio ($t_r/t_i$) in the riparian zone;

and (b) of FIG. 7 shows a relationship between nitrogen removal and a $t_r/t_i$ ratio, where the wave A/T ratio is presented on a $\log_{10}$ scale.

FIG. 8 is a schematic diagram of a device for improving nitrogen water quality of a dammed river based on reservoir operation according to an embodiment of the present disclosure.

DETAILED DESCRIPTIONS OF THE EMBODIMENTS

The technical solution of the present disclosure will be further described below with reference to the accompanying drawings.

As shown in FIG. 1, an embodiment of the present disclosure provides a method for improving nitrogen water quality of a dammed river based on reservoir operation, including following steps:

S01. selecting a dammed river to be tested, determining a study area in a riparian zone downstream of a dam, obtaining historical long-sequence water level data of the study area, and analyzing a duration (T) variation range and an amplitude (A) variation range of a historical water level;

S02. setting a plurality of groups of flood waves according to the duration variation range and the amplitude variation range, where all the flood waves have a same integral over time, which is regarded as a study driving condition;

S03. establishing a riparian zone nitrogen transport and transformation numerical model to simulate a denitrification level of the riparian zone under different flood wave conditions;

S04. obtaining an A/T ratio value of one flood wave corresponding to a maximum value of denitrification capacity of the riparian zone in combination with results of all cases; and S05. using the obtained A/T ratio value as a threshold of a reservoir discharge hydrograph to achieve reservoir optimization operation, thereby improving nitrogen water quality of the dammed river.

A riparian zone located 30 km downstream of a Hanock Dam in an Inbuk River, South Korea, is taken as an example for detailed description.

I. Selecting a Study Area

Figure 2:
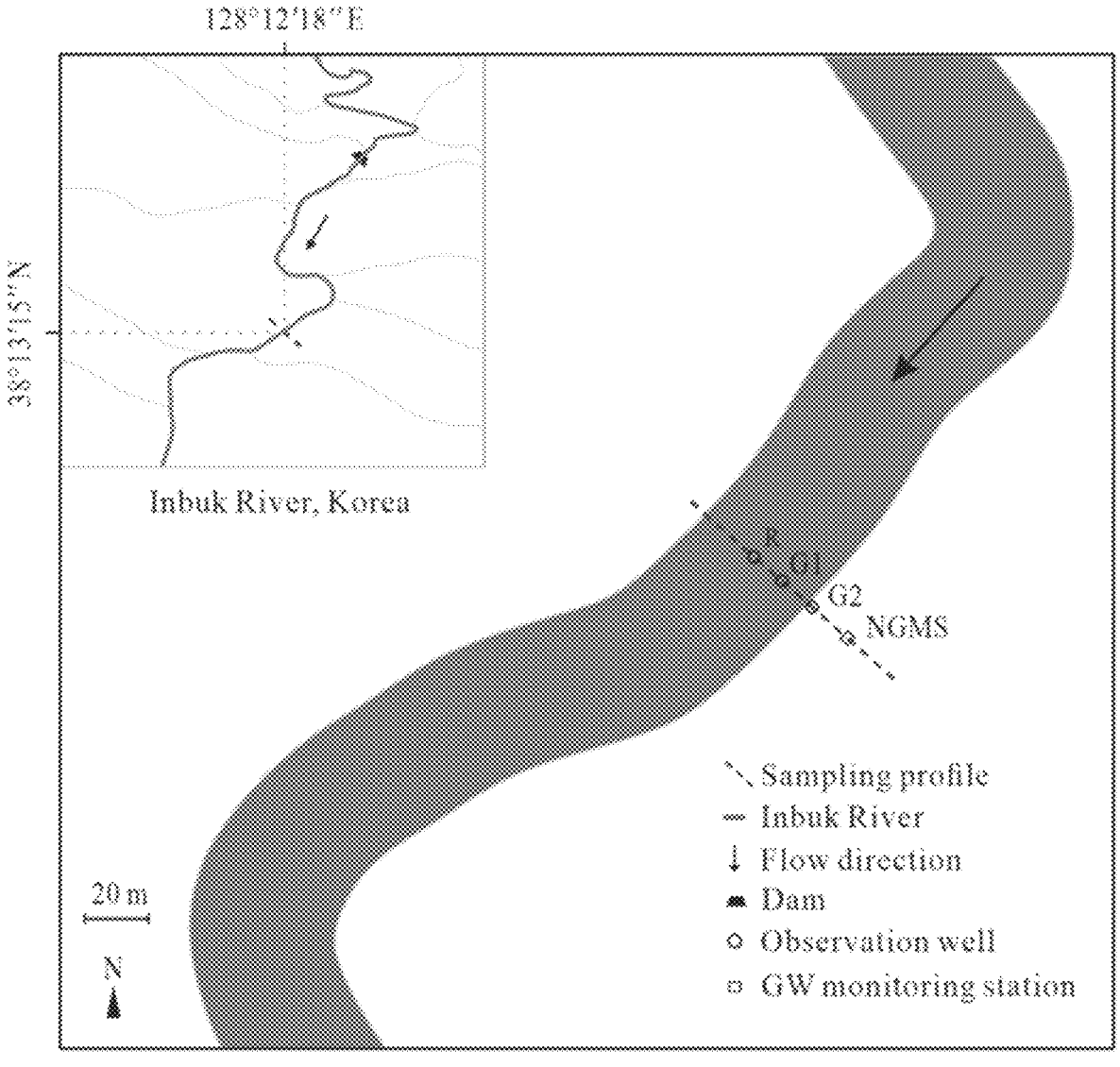
FIG. 2 is a schematic diagram of a study area downstream of Hanock Dam in an Inbuk River, South Korea; where R is a piezometer in the Inbuk River; G1 and G2 are piezometers in a hyporheic zone; NGMS means a national groundwater monitoring station; and GW means groundwater.

A riparian zone located 30 km downstream of a Hanock Dam in an Inbuk River, South Korea (38°13'15" N, 128°12'18" E) is selected. In the study area, the river water level fluctuates frequently owing to discharge from a reservoir (FIG. 2). In order to monitor water levels of the riparian zone, piezometers (R, G1 and G2) (Model-3001, Solinst) were installed at intervals of 10 m, extending from the river to the riparian zone. In addition, data from the National Groundwater Monitoring Station was also incorporated into the analysis (FIG. 2). Water level fluctuations of the river recorded on site include various waveforms, with a range of A being from 0.2 to 6 m, and a range of T being from 0.3 to 9 d. In the process of collecting water level data, efforts are made to measure background concentrations of dissolved oxygen (DO), dissolved organic carbon (DOC), and N species in the river and groundwater.

Figure 3:
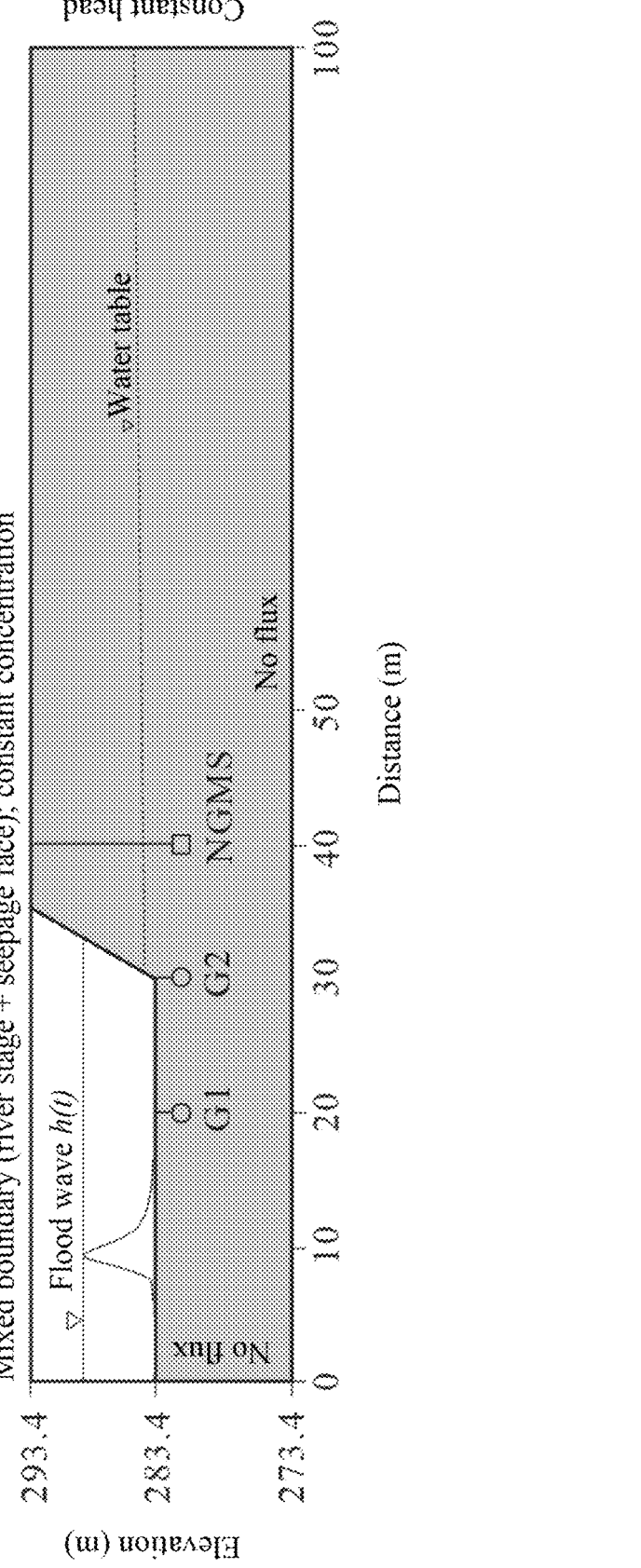
FIG. 3 is a conceptual model of nitrogen transport and transformation across a riparian zone, where a mean sea level is used as a reference point for elevation.

II. Constructing a Riparian Zone Nitrogen Transport and Transformation Numerical Model of the Study Area (1) Conceptual Model and Settings In the present disclosure, a two-dimensional (2D) model was created to simulate water and solute exchange caused by flood waves across a riverbed-riverbank continuum (FIG. 3). The 2D model had a width and a height of 100 m and 20 m, respectively. Left and bottom boundaries of the 2D model were subjected to no-flux boundary conditions. A right boundary was defined as a constant head boundary condition (Dirichlet), and a head was estimated using a hydraulic gradient between a measured groundwater table and a river water level. Effects of rainfall and evaporation were disregarded at an upper boundary above a maximum water level. Submersion below a minimum water level in the riparian zone was selected as a variable head boundary condition (Dirichlet). An area between the minimum water level and the maximum water level (drawdown area) adopted a mixed boundary condition, combining variable head conditions and flow constraints to develop a seepage face. For a water quality module, surface water and groundwater were selected as constant concentration boundaries, while remaining boundaries had no concentration boundaries. An initial head field and a concentration field in a model domain were simulated using a steady-state model. The drawdown area of the model was defined as a fixed head, which was set as a measured value at the beginning of a study period, and other boundary conditions remained unchanged.

(2) Model Control Equations and Calculations

A Richards' equation (Eq. (1)) and a convection-diffusion-reaction equation (Eq. (2)) were coupled in the model. Furthermore, the model assumed that an effective porosity and a hydraulic conductivity of an aquifer were uniformly distributed and isotropic. Changes in landform and permeability of the aquifer were disregarded.

$$S_0 \cdot s(\psi)\frac{\partial \psi}{\partial t} + \varepsilon\frac{\partial s(\psi)}{\partial t} + \nabla \cdot [-KK_r(\nabla\psi + \nabla z)] = \alpha s(\psi)\frac{\partial \sigma_T}{\partial t}, \quad (1)$$

$$\frac{\partial}{\partial t}(\theta C_i) - \nabla \cdot (\theta D \nabla C_i) + \nabla \cdot (q C_i) = R_i, \quad (2)$$

where, $S_o$ is a specific storage; s is a saturation; $\varepsilon$ is a porosity; $\psi$ is a pressure head; t is time; K is a tensor of a hydraulic conductivity of a saturated medium; $K_r$ is a relative hydraulic conductivity; z is a position head; $\alpha$ is a skeleton compression coefficient of a porous medium; $\sigma_T$ is a total stress; $\theta$ is a water content; $C_i$ is a concentration of a solute i; D is a tensor of a hydrodynamic dispersion coefficient; q is a Darcy velocity vector; and $R_i$ is a reaction rate of the solute i.

In the riparian zone, nitrogen cycling primarily involved nitrification, denitrification, and aerobic respiration, which were described by a Multi-Monod kinetic model. $R_i$ in Eq. (2) can be expressed as follows:

$$R_{O2} = -\theta U_{AR} y_{O2}\left(\frac{C_{DOC}}{K_{DOC} + C_{DOC}}\right)\left(\frac{C_{O2}}{K_{O2} + C_{O2}}\right) - \quad (3)$$
$$\theta U_{NT}(1 - y_{O2})\left(\frac{C_{NH4}}{K_{NH4} + C_{NH4}}\right)\left(\frac{C_{O2}}{K_{O2} + C_{O2}}\right),$$

$$R_{NH4} = -\theta U_{NT}\left(\frac{C_{NH4}}{K_{NH4} + C_{NH4}}\right)\left(\frac{C_{O2}}{K_{O2} + C_{O2}}\right), \quad (4)$$

$$R_{NO3} = \theta U_{NT}\left(\frac{C_{NH4}}{K_{NH4} + C_{NH4}}\right)\left(\frac{C_{O2}}{K_{O2} + C_{O2}}\right) - \quad (5)$$
$$\theta U_{DN}\left(\frac{K_I}{K_I + C_{O2}}\right)\left(\frac{C_{DOC}}{K_{DOC} + C_{DOC}}\right)\left(\frac{C_{NO3}}{K_{NO3} + C_{NO3}}\right),$$

10

-continued $$R_{DOC} = -\theta U_{AR} y_{O2}\left(\frac{C_{DOC}}{K_{DOC} + C_{DOC}}\right)\left(\frac{C_{O2}}{K_{O2} + C_{O2}}\right) - \quad (6)$$
$$\theta U_{DN}\left(\frac{K_I}{K_I + C_{O2}}\right)\left(\frac{C_{DOC}}{K_{DOC} + C_{DOC}}\right)\left(\frac{C_{NO3}}{K_{NO3} + C_{NO3}}\right),$$

where $R_{O2}$, $R_{NH4}$, $R_{NO3}$ and $R_{DOC}$ are reaction rates of $O_2$, $NH_4^+$, $NO_3^-$ and DOC, respectively; $C_{DOC}$, $C_{O2}$, $C_{NH4}$ and $C_{NO3}$ are concentrations of DOC, $O_2$, $NH_4^+$ and $NO_3^-$, respectively; $V_A$, $V_N$ and $V_D$ are maximum substrate uptake rates of aerobic respiration, nitrification, and denitrification, respectively; $X_{AR}$, $X_{NT}$ and $X_{DN}$ are functional microbial mediation coefficients for promoting the aerobic respiration, nitrification, and denitrification, respectively; $y_{O2}$ is a partition coefficient of $O_2$; $K_{DOC}$, $K_{O2}$, $K_{NH4}$ and $K_{NO3}$ are half-saturation constants of DOC, $CO_2$, $NH_4^+$ and $NO_3^-$, respectively; and $K_I$ is an inhibition constant.

FEFLOW 7.0 was employed to solve the coupled equations. A triangular mesh generator was used to discretize the model domain nonuniformly, a surface layer of the model domain was divided into finer grids, where a lower layer was set with coarser grid spacing. Total numbers of model nodes and units were 38,784 and 76,876, respectively. During modeling, a time step was automatically controlled, with initial and maximum values of 0.001 and 0.05 d, respectively. An error tolerance of 0.01 m was set for the modeled head. Parameters inputted into the model were obtained from either existing literature or measured values (Table 1).

TABLE 1

| Parameters Inputted into the Model | | |
|---|---|---|
| Parameters | Input values | Units |
| Flow parameters | | |
| Hydraulic conductivity (K) | 2.99 | m/d |
| Effective porosity | 0.41 | — |
| Specific storage ($S_0$) | 0.0001 | 1/m |
| Residual saturation ($s_r$) | 0.15 | — |
| Maximum saturation ($s_s$) | 0.96 | — |
| Retention curve fitting parameter ($\alpha$) | 7.5 | 1/m |
| Aperture distribution index (n) [a] | 1.95 | — |
| Longitudinal dispersivity ($D_L$) | 0.1 | m |
| Transverse/longitudinal dispersivity ($D_T/D_L$) | 0.1 | — |
| Water quality parameters | | |
| $O_2$ concentration in the river ($C_{O2}$) | 5 | mg/L |
| $NO_3^-$ concentration in the river ($C_{NO3}$) | 0.05 | mg/L |
| $NH_4^+$ concentration in the river ($C_{NH4}$) | 5 | mg/L |
| DOC concentration in the river ($C_{DOC}$) | 5 | mg/L |
| Groundwater nitrogen concentration | 0 | mg/L |
| Unit maximum aerobic respiration rate ($U_{AR}$) | 2 | mg/L/d |
| Unit maximum nitrification rate ($U_{NI}$) | 1.05 | mg/L/d |
| Unit maximum denitrification rate ($U_{DN}$) | 2 | mg/L/d |
| Half-saturation constant for $O_2$ ($K_{O2}$) | 1 | mg/L |
| Half-saturation constant for $NO_3^-$ ($K_{NO3}$) | 0.5 | mg/L |
| Half-saturation constant for $NH_4^+$ ($K_{NH4}$) | 1 | mg/L |
| Half-saturation constant for DOC ($K_{DOC}$) | 5 | mg/L |
| Oxygen inhibition constant ($K_I$) | 1 | mg/L |
| Partition coefficient for oxygen ($y_{O2}$) | 0.64 | — |

III. Design of Flood Wave Cases in the Study Area

Flood waves in the study area can be numerically formulated as follows $$h(t) = h_0 + A\sin^r\left[\left(\frac{t}{T}\right)^{-\ln 2/\ln\left(\frac{t_p}{T}\right)}\pi\right], \quad (7)$$

where $h_0$ is a river bottom elevation (m); A, T, $t_p$ and r are an amplitude (m), a duration (d), a duration of water level rise (=T/4) and a waveform parameter (=2) of the flood wave, respectively.

Figure 4:
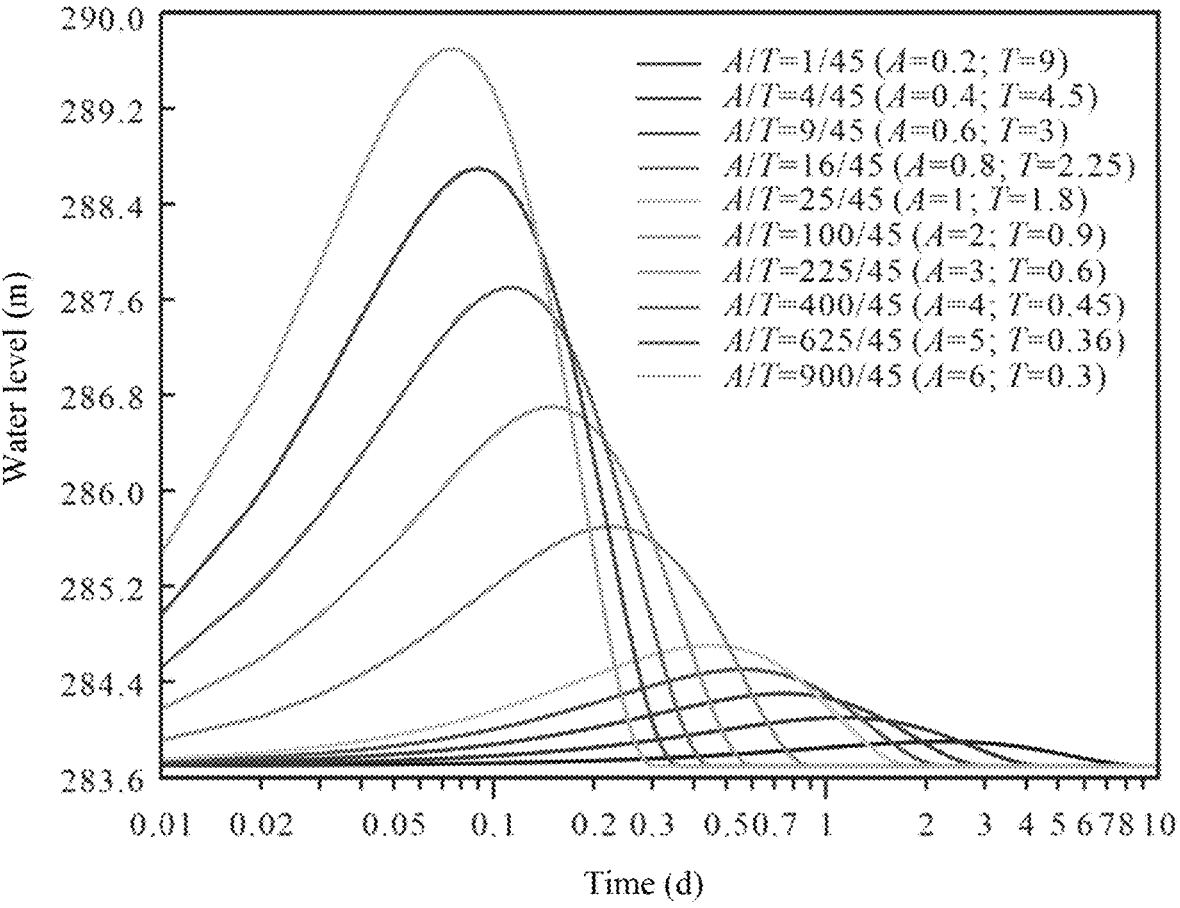
FIG. 4 shows all flood wave scenarios at a fixed integral of the flood wave over time, where time (t) is presented on a $\log_{10}$ scale.

On-site water level data in 2013 and 2014 were collected. In this embodiment, different flood waves ($0.2 \leq A \leq 6m$; $0.3 \leq T \leq 9d$) were generated according to observed ranges and utilized for simulations (Table 2; FIG. 4).

TABLE 2

| Summary of the flood wave parameters at a fixed integral of the flood wave over time | | | | | | | | | |
|---|---|---|---|---|---|---|---|---|---|
| | Case 1 | Case 2 | Case 3 | Case 4 | Case 5 | Case 6 | Case 7 | Case 8 | Case 9 | Case 10 |
| A | 0.2 | 0.4 | 0.6 | 0.8 | 1 | 2 | 3 | 4 | 5 | 6 |
| T | 9 | 4.5 | 3 | 2.25 | 1.8 | 0.9 | 0.6 | 0.45 | 0.36 | 0.3 |
| A/T | 1/45 | 4/45 | 9/45 | 16/45 | 25/45 | 100/45 | 225/45 | 400/45 | 625/45 | 900/45 |
| $\int h(t)$ | 1.8 | 1.8 | 1.8 | 1.8 | 1.8 | 1.8 | 1.8 | 1.8 | 1.8 | 1.8 |

IV. Methods for Calculating Hyporheic Exchange and Nitrogen Removal in the Riparian Zone of the Study Area A water infiltration volume per unit length along the river was defined as follows:

$$Q(t) = \int_0^T dt \int_0^l v(l, t) dl, \tag{8}$$

where v (l,t) is a normal velocity along the drawdown area (m/d); l is a length of the drawdown area (m); and t is time (d).

Time taken for Q(t) to increase from zero to a maximum value thereof was defined as infiltration time ($t_i$) of the water volume, and time required for Q(t) to decrease from the maximum value to zero was defined as return time ($t_r$) of the water body. A sum of $t_i$ and $t_r$ was residence time of an infiltrating water body.

Infiltration amount of a solute j (per unit length along the river) was calculated as follows:

$$M_j(t) = \int_0^T dt \int_0^l [v(l, t) \cdot c_j(l, t) + D \cdot i(l, t)] dl, \tag{9}$$

where $c_j(l,t)$ is a concentration of the solute j at a river-sediment interface (mg/L); D is a hydrodynamic dispersion coefficient (m); and i(l,t) is a solute gradient between the river and the groundwater (mg/L).

Amount of nitrogen removal in the riparian zone (per unit length along the river) was calculated as follows:

$$M_{rem} = [M_{Cl}^-(t) - M_{NO3}^-(t)]|_{t=RT}, \tag{10}$$

where $M_{Cl}^-(t)$ and $M_{NO3}^-(t)$ are infiltration amounts of a conservative solute ($Cl^-$) and a reactive solute ($NO_3^-$—N) during one water level fluctuation cycle, respectively (per unit length along the river) (g/m), respectively; and RT is average residence time of the solutes (d).

Figure 5:
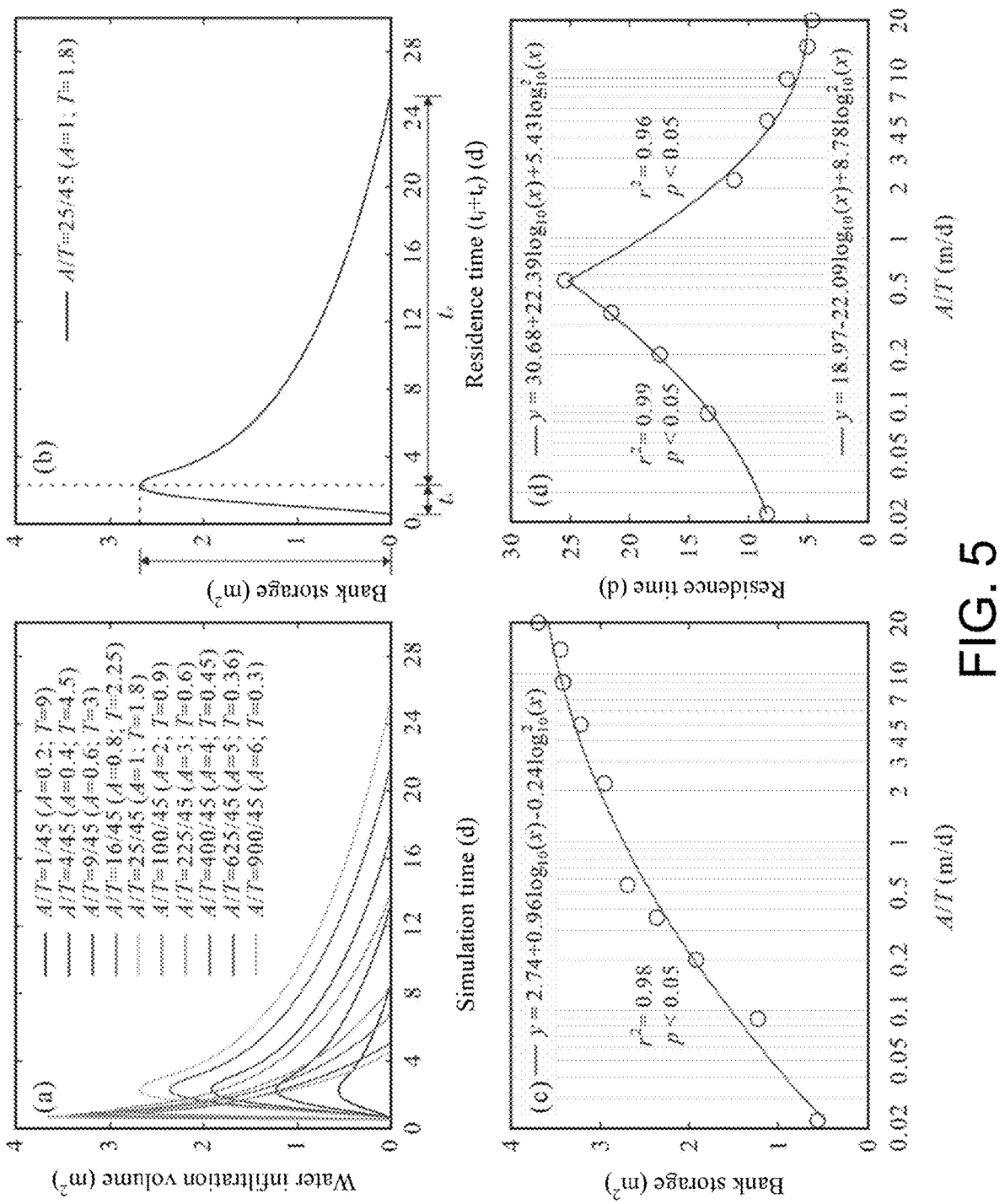
FIG. 5 shows effects of a wave A/T ratio on hyporheic exchange in a riparian zone, where (a) is water infiltration volume per unit length along the river under various wave cases; (b) is a schematic diagram of the characterization of hyporheic exchange characteristics; (c) shows changes in a maximum water storage of the riparian zone with a shifting wave A/T ratio; and (d) shows changes in water residence time with the shifting wave A/T ratio, where the wave A/T ratio is presented on a $\log_{10}$ scale.

V. Calculation Results (1) Effects of A/T Ratio on Hyporheic Exchange (a) of FIG. 5 depicts dynamics of the water infiltration volume in the riparian zone under various flood wave scenarios. By estimation ((b) of FIG. 5), bank storage increased with an increasing A/T ((c) of FIG. 5), exhibiting an exponential positive correlation with $\log_{10}$ (A/T ratio) ($r^2=0.98$, $p<0.05$). To further analyze a median residence time, a curve-fitting analysis was performed ((d) of FIG. 5). The median residence time exhibited a significant positive correlation with $\log_{10}$ (A/T ratio) ($r^2=0.99$, $p<0.05$) when the wave A/T ratio was less than 25/45. However, in other cases, the correlation was negative ($r^2=0.96$, $p<0.05$).

(2) Effects of the Wave A/T Ratio on Nitrogen Removal in the Riparian Zone

Figure 6:
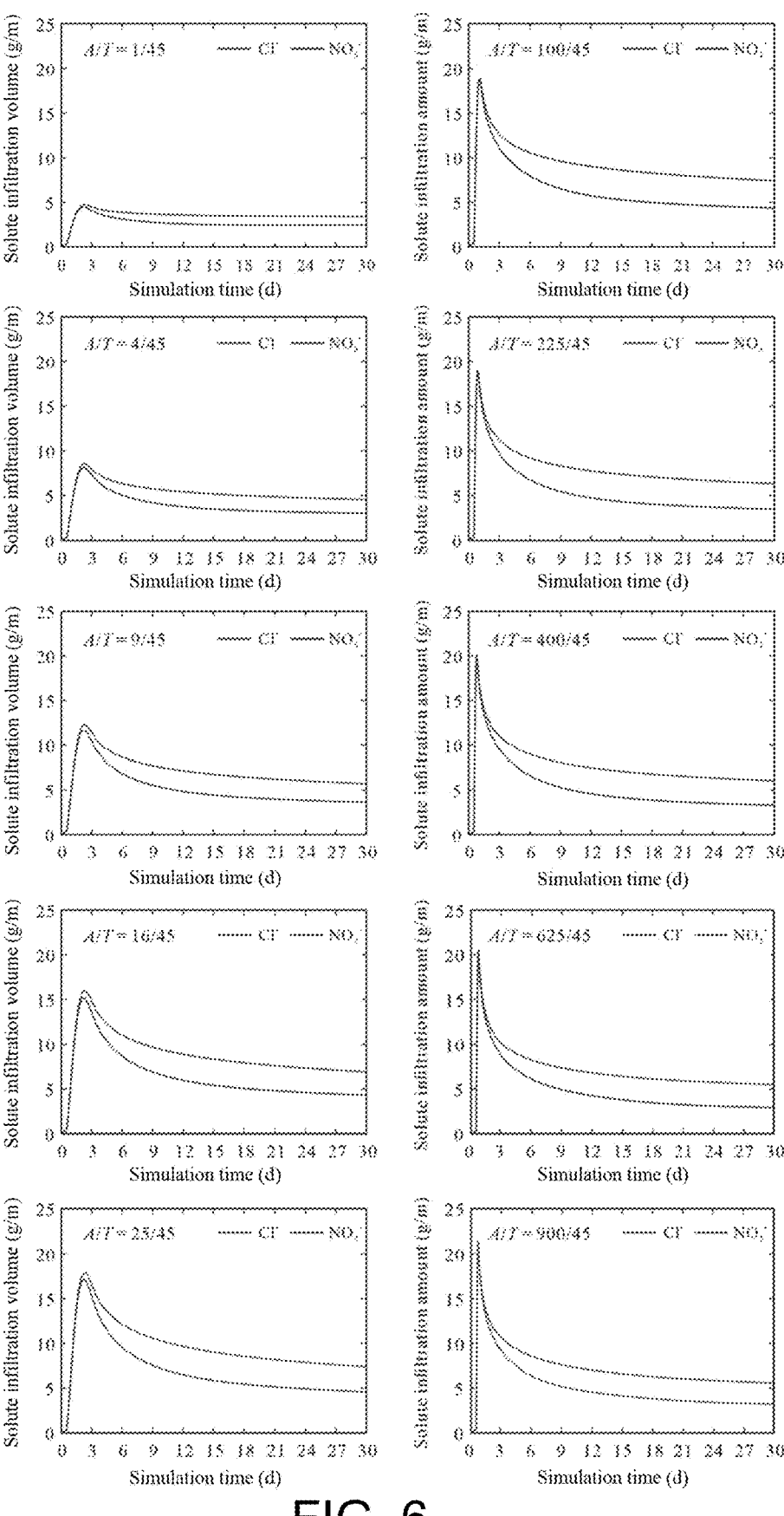
FIG. 6 shows changes of infiltration amounts of a conservative solute ($Cl^-$) and a reactive solute ($NO^{3-}$—N) in a riparian zone with a shifting wave A/T ratio.

FIG. 6 illustrates rapid infiltration of the solutes into the riparian zone during the rise of water levels. However, outflow time of the solutes from the riparian zone was prolonged, causing the retention of a certain amount of the solutes within the riparian zone. As the wave A/T ratio increased, the amount of solute infiltration also increased, but a ratio of solute mass retention to total infiltration decreased. The study observed a small difference between the conservative solute and the reactive resolute. However, a retention rate of the conservative solute ($Cl^-$) was significantly higher than that of the reactive solute ($NO3^-$-N), This scenarios reflected a consumption process of the reactive solutes in the riparian zone during water level fluctuations. It was observed ((a) of FIG. 7) that the amount of nitrogen removal in the riparian zone initially increased and then decreased as the A/T ratio increased. A threshold was accordingly identified for the wave A/T ratio that maximized nitrogen removal in the riparian zone. Furthermore, a significant positive correlation was found between the nitrogen removal and the return/infiltration time ratio ($t_r/t_i$) ($y=0.28x+0.39$, $r^2=0.93$, $p<0.05$) ((b) of FIG. 7).

As shown in FIG. 8, an embodiment of the present disclosure provides a device for improving nitrogen water quality of a dammed river based on reservoir operation, including:

a data acquisition module, where the data acquisition module is configured to select a dammed river to be tested, determine a study area in a riparian zone downstream of a dam, obtain historical long-sequence water level data of the study area, and analyze a duration (T) variation range and an amplitude (A) variation range of a historical water level;

a driving condition setting module, where the driving condition setting module is configured to set a plurality of groups of flood waves according to the duration variation range and the amplitude variation range, which is regarded as a study driving condition;

a riparian zone nitrogen transport and transformation numerical model, where the riparian zone nitrogen transport and transformation numerical model is configured to simulate a denitrification level of the riparian zone under different flood wave conditions;

an A/T ratio value calculation and analysis and threshold determination module, where the A/T ratio value calculation and analysis and threshold determination module is configured to obtain an A/T ratio value of one flood wave corresponding to a maximum value of denitrification capacity of the riparian zone in combination with results of all cases; and a reservoir optimization operation mode, where the reservoir optimization operation module is configured to take the obtained A/T ratio value as a threshold of a reservoir discharge hydrograph to achieve reservoir optimization operation, thereby improving nitrogen water quality of the dammed river.

An embodiment of the present disclosure further provides a computer-readable medium having a computer program stored thereon, and when the computer program is executed by a processor, the foregoing method for improving nitrogen water quality of a dammed river based on reservoir operation is implemented.

An embodiment of the present disclosure further provides an electronic device, including: one or more processors; and a storage device configured to store one or more programs, and when the one or more programs are executed by the one or more processors, the one or more processors implement the foregoing method for improving nitrogen water quality of a dammed river based on reservoir operation.

Beneficial effects: compared with the prior art, the present disclosure has the following significant advantages: the discharge hydrograph of the reservoir optimization design method provided in the present disclosure can reach a removal efficiency of 10% of the nitrogen nutrient salt in the dammed river, and the water environment condition of the dammed river can be effectively improved.

What it claimed is:

1. A method for improving nitrogen water quality of a dammed river based on reservoir operation, comprising following steps:

obtaining a dammed river and a study area in a riparian zone downstream of a dam, obtaining historical long-sequence water level data of the study area, and analyzing a duration (T) variation range and an amplitude (A) variation range of a historical water level;

setting a plurality of groups of flood waves according to the duration variation range and the amplitude variation range, wherein all the flood waves have a same integral over time, which is regarded as a study driving condition;

establishing a riparian zone nitrogen transport and transformation numerical model to simulate a denitrification level of the riparian zone under different flood wave conditions;

wherein the riparian zone nitrogen transport and transformation numerical model is a two-dimensional (2D) model, and in the 2D model, model control equations comprise:

$$S_0 \cdot s(\psi)\frac{\partial \psi}{\partial t} + \varepsilon\frac{\partial s(\psi)}{\partial t} + \nabla \cdot [-KK_r(\nabla\psi + \nabla z)] = \alpha s(\psi)\frac{\partial \sigma_T}{\partial t}, \quad (1)$$

$$\frac{\partial}{\partial t}(\theta C_i) - \nabla \cdot (\theta D\nabla C_i) + \nabla \cdot (qC_i) = R_i, \quad (2)$$

wherein $S_o$ is a specific storage; s is a saturation; $\varepsilon$ is a porosity; $\psi$ is a pressure head; t is time; K is a tensor of a hydraulic conductivity of a saturated medium; $K_r$ is a relative hydraulic conductivity; z is a position head; $\alpha$ is a skeleton compression coefficient of a porous medium; $\sigma_T$ is a total stress; $\theta$ is a water content; $C_i$ is a concentration of a solute i; D is a tensor of a hydrodynamic dispersion coefficient; q is a Darcy velocity vector; and $R_i$ is a reaction rate of the solute i,

$R_i$ in Equation (2) is expressed as follows:

$$R_{O2} = -\theta U_{AR}y_{O2}\left(\frac{C_{DOC}}{K_{DOC}+C_{DOC}}\right)\left(\frac{C_{O2}}{K_{O2}+C_{O2}}\right) - \quad (3)$$
$$\theta U_{NT}(1-y_{O2})\left(\frac{C_{NH4}}{K_{NH4}+C_{NH4}}\right)\left(\frac{C_{O2}}{K_{O2}+C_{O2}}\right),$$

$$R_{NH4} = -\theta U_{NT}\left(\frac{C_{NH4}}{K_{NH4}+C_{NH4}}\right)\left(\frac{C_{O2}}{K_{O2}+C_{O2}}\right), \quad (4)$$

$$R_{NO3} = \theta U_{NT}\left(\frac{C_{NH4}}{K_{NH4}+C_{NH4}}\right)\left(\frac{C_{O2}}{K_{O2}+C_{O2}}\right) - \quad (5)$$
$$\theta U_{DN}\left(\frac{K_I}{K_I+C_{O2}}\right)\left(\frac{C_{DOC}}{K_{DOC}+C_{DOC}}\right)\left(\frac{C_{NO3}}{K_{NO3}+C_{NO3}}\right),$$

$$R_{DOC} = -\theta U_{AR}y_{O2}\left(\frac{C_{DOC}}{K_{DOC}+C_{DOC}}\right)\left(\frac{C_{O2}}{K_{O2}+C_{O2}}\right) - \quad (6)$$
$$\theta U_{DN}\left(\frac{K_I}{K_I+C_{O2}}\right)\left(\frac{C_{DOC}}{K_{DOC}+C_{DOC}}\right)\left(\frac{C_{NO3}}{K_{NO3}+C_{NO3}}\right),$$

wherein $R_{O2}$, $R_{NH4}$, $R_{NO3}$ and $R_{DOC}$ are reaction rates of $O_2$, $NH_4^+$, $NO_3^-$ and DOC, respectively; $C_{DOC}$, $C_{O2}$, $C_{NH4}$ and $C_{NO3}$ are concentrations of DOC, $O_2$, $NH_4^+$ and $NO_3^-$, respectively; $y_{O2}$ is a partition coefficient of $O_2$; $K_{DOC}$, $K_{O2}$, $K_{NH4}$ and $K_{NO3}$ are half-saturation constants of DOC, $C_{O2}$, $NH_4^+$ and $NO_3^-$, respectively; and $K_I$ is an inhibition constant;

wherein in a process of simulating a denitrification level of the riparian zone under different flood wave conditions, flood waves are numerically formulated as follows:

$$h(t) = h_0 + A\sin^r\left[\left(\frac{t}{T}\right)^{-\ln 2/\ln\left(\frac{t_p}{T}\right)}\pi\right], \quad (7)$$

wherein $h_0$ is a river bottom elevation; A, T, $t_p$ and r are an amplitude, a duration, a duration of water level rise and a waveform parameter of the flood wave, respectively;

wherein in a process of simulating a denitrification level of the riparian zone under different flood wave conditions, methods for calculating hyporheic exchange and nitrogen removal in the riparian zone of the study area comprise:

a water infiltration volume per unit length along the river is defined as follows:

$$Q(t) = \int_0^t dt \int_0^l v(l,t)dl, \quad (8)$$

wherein v(l,t) is a normal velocity along the drawdown area; l is a length of the drawdown area; and t is time; time taken for Q(t) to increase from zero to its maximum value is defined as infiltration time ($t_i$) of a water body, and time required for Q(t) to decrease from the maximum value to zero is defined as return time ($t_r$) of the water body; and a sum of $t_i$ and $t_r$ is residence time of an infiltrating water body;

infiltration amount of a solute j per unit length along the river is calculated as follows:

$$M_j(t) = \int_0^t dt \int_0^l [v(l,t)\cdot c_j(l,t) + D\cdot i(l,t)]dl, \quad (9)$$

15 wherein $c_j(l,t)$ is a concentration of the solute j at a river-sediment interface; D is a hydrodynamic dispersion coefficient; and $i(l,t)$ is a solute gradient between the river and the groundwater;

amount of nitrogen removal in the riparian zone per unit length along the river is calculated as follows:

$$M_{rem} = [M_{Cl^-}(t) - M_{NO3^-}(t)]|_{t=RT}, \qquad (10)$$

wherein $M_{Cl^-}(t)$ and $M_{NO3^-}(t)$ are infiltration amounts of a conservative solute ($Cl^-$) and a reactive solute ($NO_3^-$—N) per unit length along the river during one water level fluctuation cycle, respectively, respectively; and RT is average residence time of the solutes;

obtaining an A/T ratio value of one flood wave corresponding to a maximum value of denitrification capacity of the riparian zone in combination with results of all cases; and

controlling a discharge gate of the dam based on the obtained A/T ratio value for the purpose of increasing amount of water infiltrated into the riparian zone and the residence time, for the purpose of increasing in infiltration volume of the solutes increase and a longer time period of chemical reaction, and for the purpose of improving nitrogen water quality of the dammed river.

2. The method for improving nitrogen water quality of a dammed river based on reservoir operation according to claim 1, wherein a series of flood wave cases with a fixed integral over time are provided and used to calculate and analyze change rules of denitrification capacity of the riparian zone below the dam along with a wave A/T ratio, and on this basis, an A/T ratio of a discharge hydrograph is determined based on the premise of analyzing a fixed reservoir water volume for the purpose of maximizing the denitrification in the downstream of the riparian zone, and further wherein the series of flood wave cases constitute parameters as follows:

| | Case 1 | Case 2 | Case 3 | Case 4 | Case 5 | Case 6 | Case 7 | Case 8 | Case 9 | Case 10 |
|---|---|---|---|---|---|---|---|---|---|---|
| A | 0.2 | 0.4 | 0.6 | 0.8 | 1 | 2 | 3 | 4 | 5 | 6 |
| T | 9 | 4.5 | 3 | 2.25 | 1.8 | 0.9 | 0.6 | 0.45 | 0.36 | 0.3 |
| $\dfrac{A}{T}$ | $\dfrac{1}{45}$ | $\dfrac{4}{45}$ | $\dfrac{9}{45}$ | $\dfrac{16}{45}$ | $\dfrac{25}{45}$ | $\dfrac{100}{45}$ | $\dfrac{225}{45}$ | $\dfrac{400}{45}$ | $\dfrac{625}{45}$ | $\dfrac{900}{45}$ |
| $\int h(t)$ | 1.8 | 1.8 | 1.8 | 1.8 | 1.8 | 1.8 | 1.8 | 1.8 | 1.8 | 1.8. |

3. The method for improving nitrogen water quality of a dammed river based on reservoir operation according to claim 1, wherein in the 2D model, left and bottom boundaries of the 2D model are subjected to no-flux boundary conditions; a right boundary of the 2D model is defined as a constant head boundary condition; disregarding at an upper boundary above a maximum water level for the purpose of disregarding effects of rainfall and evaporation; submersion below a minimum water level in the riparian zone is obtained as a variable head boundary condition; an area between the minimum water level and the maximum water level adopt a mixed boundary condition, combining variable head conditions and flow constraints to develop a seepage face; for a water quality module, surface water and groundwater are selected as constant concentration boundaries, while remaining boundaries have no concentration boundaries; an initial head field and a concentration field in a model domain are simulated using a steady-state model; a boundary of the area between the minimum water level and the maximum water level is defined as a fixed head, which is set as a measured value at the beginning of a study period, and other boundary conditions remain unchanged.

* * * * *